United States Patent [19]

Ovshinsky et al.

[11] Patent Number: 4,853,785

[45] Date of Patent: * Aug. 1, 1989

[54] ELECTRONIC CAMERA INCLUDING ELECTRONIC SIGNAL STORAGE CARTRIDGE

[75] Inventors: Stanford R. Ovshinsky, Bloomfield Hills, Mich.; Lawrence G. Norris, Sterling, Va.

[73] Assignee: Energy Conversion Devices, Inc., Troy, Mich.

[ * ] Notice: The portion of the term of this patent subsequent to Nov. 29, 2005 has been disclaimed.

[21] Appl. No.: 197,353

[22] Filed: May 23, 1988

Related U.S. Application Data

[63] Continuation-in-part of Ser. No. 918,952, Oct. 15, 1986, Pat. No. 4,788,594.

[51] Int. Cl.$^4$ .............................................. H04N 3/14
[52] U.S. Cl. ............................. 358/213.11; 358/909
[58] Field of Search ..................... 358/213.11, 213.29, 358/213.31, 213.12, 294, 212; 346/135.1

[56] References Cited

U.S. PATENT DOCUMENTS

| | | | |
|---|---|---|---|
| 4,335,405 | 6/1982 | Sakane et al. | 358/213.19 |
| 4,482,804 | 11/1984 | Oritsuki et al. | 358/213.11 |
| 4,489,351 | 12/1984 | d'Alayer de Costemore d'Arc | 358/909 |
| 4,541,010 | 9/1985 | Alston | 358/44 |
| 4,676,646 | 6/1987 | Strand et al. | 356/381 |

Primary Examiner—Jin F. Ng
Assistant Examiner—Stephen Brinich
Attorney, Agent, or Firm—Marvin S. Siskind; Richard M. Goldman

[57] ABSTRACT

An electronic camera system, which system comprises the combination of an image digitizer media and a digital signal storage media. The camera includes an x-y matrix formed of a thin film photosensor array of small area photosensitive elements capable of providing high resolution digitized electrical signal corresponding to an image projected thereon. The storage media is preferably formed as a layer of phase change optical memory material deposited upon an elongated tape or disc-like number and disposed in a cartridge-like housing which is removably positioned in the camera adjacent a writing mechanism such as a multi-headed laser. By utilizing multiple lasers, it is possible to simultaneously write on the entire width of the tape or disc for increasing processing speed.

30 Claims, 5 Drawing Sheets

ELECTRONIC CAMERA INCLUDING ELECTRONIC SIGNAL STORAGE CARTRIDGE

CROSS-REFERENCE TO RELATED APPLICATIONS

This application is a continuation-in-part of U.S. patent application Ser. No. 918,952 filed Oct. 15, 1986 entitled "Solid State Electronic Camera Including Thin Film Matrix Of Photosensors" now U.S. Pat. No. 4,788,594.

FIELD OF THE INVENTION

This invention relates generally to photographic apparatus and, more particularly, to an electronic photographic system which incorporates therein both a large area thin film photosensor array adapted to photogenerate digital signals providing high resolution images and a storage media adapted to store those digitized high resolution signals.

BACKGROUND OF THE INVENTION

Photographic technology has enjoyed an ever increasing growth since its inception more that 150 years ago. What began as a curiosity requiring long exposure times to produce low quality image reproductions has now advanced to become a large and diverse technology having widespread utility for both commercial and recreational purposes.

Photography has, until recently, been a process based upon chemical reactions, typically of photosensitive salts of precious metals such as silver and platinum. While such processes have been optimized to provide high sensitivity, good resolution and reliable performance, they suffer from several shortcomings. Chemically based photographic systems consume relatively large amounts of both precious metals and specially synthesized organic chemicals; consequently, such chemical processes tend to be fairly expensive. Furthermore, chemical processes require fairly strict control of time and temperature conditions in order to produce uniformly reliable results. Additionally, chemical based photographic systems require the storage and deployment of relatively large amounts of photographic film within a camera, and necessitate, in most instances, complex processing equipment.

Due to, inter alia, the foregoing limitations of chemically-based photographic systems, the photographic industry has explored the possibility of adapting presently emerging electronic imaging technologies. Image scanners are enjoying growing utility in a variety of products and for a diversity of applications such as, without limitation, television cameras, input of alpha numeric data to computers and machine vision systems. Optical scanning systems typically include one or more photosensor arrays, each array including a plurality of photoresponsive elements. For purposes of describing the present invention, the terms "photosensitive element" and "photoresponsive element" shall be interchangeably employed and broadly applied to include any element capable of producing a detectable electrically digitized signal in response to the absorption of illumination incident thereupon. By way of example, such detectable signals may be provided by a detectable change in voltage, current, resistivity, capacitance or the like.

Electronic arrays of photosensitive elements are capable of providing a signal corresponding to a pattern of information projected thereupon; and consequently, such arrays may be utilized to partially replace conventional photographic film by providing an electronic imaging system free of the shortcomings inherent in chemically based photographic systems.

Charge Coupled Devices (CCDs) represent one type of photosensor array which has heretofore been employed in electronic photographic applications. CCDs are solid state devices, typically formed from single crystal silicon and which include therein an array of photoresponsive elements. CCDs are highly photosensitive and are capable of providing high resolution images. However, CCDs are relatively small in size; the typical CCD array being a two dimensional matrix approximately one centimeter square. The largest CCDs currently produced are one dimensional arrays no greater than approximately 3 to 4 inches in length. Obviously, these size constraints impose restrictions on the utility of CCDs for electronic photographic applications. It is to be noted that, while CCDs generally provide a high degree of resolution, in order to have commercial impact and to be of practical utility for photographic applications, an optical reduction system must be employed. Since such optical systems project a reduced size image of the object being photographed onto the surface of the CCD, said optical reduction systems have the undesirable affect of effectively decreasing the resolution of the CCD.

The optical system, itself, degrades image resolution to some degree, but, the actual reduction process is the factor which most severely degrades the effective resolution of the image formed by a CCD. For example, a typical two dimensional CCD array is one centimeter square and includes therein approximately 256,000 photosensor units, generally referred to as pixels. To translate this into photographic terminology, the equivalent resolution would be about 50 lines/mm for the one centimeter square CCD array. When an image or other pattern of information occupying an area of 35×35 millimeters is projected onto this one centimeter square charge coupled device, the effective resolution of the 35 millimeter square image is reduced to approximately 15 lines/mm. For the sake of comparison, medium resolution photographic film is generally capable of resolving approximately 120 lines/mm.

Efforts to improve resolution using single crystal integrated circuits, such as CCDs, have encountered at least two significant problems. The first problem is that integrated circuit chips formed on single crystal silicon wafers must be as small as possible to provide acceptable yields and to meet the requirements imposed by the economies of manufacturing. The second problem, which is intimately related to the first, is that in order to increase the packing density of photosensor elements in the small available chip area, finer and finer photolithography must be used, with resulting increases in the cost of manufacture. For these reasons, among others, high resolution electronic photography (high resolution being defined relative to chemical photographic capabilities) utilizing present CCD technology is not economically feasible. A direct analogy would be that employing conventional CCD technology in a camera is akin to taking photographs on high grain (50 lines/mm) photographic film, utilizing a format which provides negatives 1 centimeter square. It is simply not possible to obtain good quality enlargements from such a combination.

With improvements in lithographic techniques, it is anticipated that one centimeter square CCDs may ultimately be fabricated to include 1.4 million pixels therein. This translates to a resolution of approximately 120 lines/mm on the one centimeter square device and a corresponding effective resolution of 34 lines/mm for a 35 millimeter square pattern of information projected thereonto. The only way the resolution of the CCD could be further increased is by increasing either the density of pixels in the CCD or the size of the device itself. Both approaches present significant problems. On one hand, the diffraction limit of light will ultimately impose limits on any photolithographic process utilized to pattern CCDs, although constraints of practicality and cost will generally intervene first to set an economic limit on pixel density. On the other hand, processing constraints will limit the size of crystalline CCDs which can be manufactured. Single crystal wafers cannot generally be economically manufactured in sizes exceeding perhaps six to eight inches in diameter. Furthermore, processing steps introduce defects and hence, severe yield-related restrictions into such devices.

Increasing the size of a crystalline device, such as a CCD, especially while maintaining strict limits on the size of the photolithographic features thereof, imposes a great burden of cost insofar as the likelihood of creating defects on a device exponentially increases along with a dramatic decrease in the yield. The result is that the cost of the finished product increases exponentially with increasing device size. It should thus be appreciated that even utilizing the most optimistically projected pixel densities and single crystalline CCD sizes, electronic cameras capable of providing high resolution photographs of a practical size cannot be economically manufactured utilizing such technology.

BRIEF SUMMARY OF THE INVENTION

Deposited thin film devices represent another approach to the fabrication of photosensor arrays for electronic photography. Thin film devices may be economically manufactured over large areas by the vapor deposition of successive layers of appropriately selected "amorphous" semiconductor alloy materials onto a variety of substrates. As used herein, the term "amorphous" includes all materials or alloys which have long range disorder although they may have short or intermediate range order, or even contain at times, crystalline inclusions. Also as used herein, the term "microcrystalline" is defined as a unique class of said amorphous materials characterized by a volume fraction of crystalline inclusions, said volume fraction of inclusions being greater than a threshold value at which the onset of substantial changes in certain key parameters such as electrical conductivity, band gap and absorption constant occur. By patterning these layers of amorphous semiconductor alloy material, as for example, through the use of presently available photolithographic techniques, a variety of high resolution device configurations may be provided. It was toward the object of obtaining high resolution electronic images utilizing such large area arrays of thin film photosensitive elements for photographic applications that the parent of the instant patent application, i.e., patent application Ser. No. 918,952 filed Oct. 15, 1986, was directed.

Thin film semiconductor alloy materials may be readily manufactured to cover large areas by mass production processes and therefore provide for the economic fabrication of large scale photosensor arrays. The use of such large arrays effectively increases the "negative" size in a photographic process, thereby permitting the generation of high quality (high resolution, high sensitivity) photographs. Additionally, thin film photosensor arrays may be manufactured in a wide variety of sizes, thus permitting them to function as a part of a combination which forms a direct electronic replacement analog of chemically processed photographic film. In this manner, a conventional camera may be converted to an electronic camera by the simple expedient of installing the appropriate thin film photosensor array, without the need for changing the optical system thereof.

If a thin film photosensor array is fabricated having a 50 micron pitch, that is to say 50 microns center-to-center spacing between the adjacent photosensitive elements thereof, the array will provide a resolution of 20 lines/mm. Since the array may be made larger than the 1 cm square CCD, its effective resolution will be higher than that of the CCD. For example, if the array of thin film photosensitive elements is 35 mm square, the resolution thereof will be better than that attainable when scanning a 35 millimeter square pattern of information with presently available CCDs. At the present point in time, a fifty micron pitch can be fabricated with at very high yields utilizing conventional photolithographic techniques. If the pitch remained the same and a photosensor array of approximately 54 millimeters on an edge were fabricated, a 1.4 million pixel array would be realized.

Such arrays can be readily fabricated in 4"×5" and 8"×10" formats. Thus, it may be seen that by increasing the size of the photosensor array, and with presently available processing techniques, high resolution electronic photography is practical. Since thin film photosensor arrays can be made in sizes up to several feet, even without any additional technological advances, the image resolving power of charge coupled devices can be exceeded by orders of magnitude.

Even though the foregoing discussion has been based upon the use of a 50 micron pitch, it is currently possible to fabricate thin film photosensor arrays characterized by a 29 micron pitch (or better). The use of said 29 micron pitch will increase the total number of pixels of the aforementioned 35 millimeter square array to about 1.4 million. Obviously, by utilizing still larger arrays, even higher image resolutions may be achieved. Techniques for the fabrication of two dimensional photosensor arrays are found in commonly assigned U.S. Pat. No. 4,660,095 entitled "Contact Type Document Scanner And Method", filed May 4, 1984, the disclosure of which is incorporated herein by reference.

In addition to the use of two dimensional arrays, as described in the foregoing paragraph, the principles of the instant invention may be similarly employed in conjunction with linear photosensor arrays. Sensing a detectable pattern of information may be accomplished with a linear array of photosensitive elements by scanning, or passing that array across the pattern of information. It is presently possible to fabricate linear photosensor arrays in sizes exceeding several meters. The use of such arrays in an electronic camera provides for ultra-high resolution imaging (UHRI). Techniques for the fabrication of such large arrays are found in commonly assigned U.S. Pat. No. 4,725,889 filed July 15, 1986, and entitled "Photosensitive Line Imager Utilizing A Movable Scanning Arm", the disclosure of which is incorporated herein by reference. As described in the foregoing references, it is possible to design thin film array of photosensor elements having gray scale and color sensitivity capabilities and by utilizing such capabilities, full color, high resolution images may be readily reproduced.

It should therefore be apparent that the parent of the instant invention eliminates constraints heretofore present in electronic cameras utilizing charge coupled devices or similar integrated circuits fabricated on single crystal wafers. The invention disclosed in said parent of the instant application thus made possible high resolution electronic photographic systems which were characterized by ease of use and economy of fabrication.

While the parent invention thereby provided a means of obtaining digitized output signals characterized by very high image resolution through the use of arrays of photosensor elements fabricated from amorphous silicon or germanium alloy materials, the electrical signals photogenerated by those arrays still had to be interconnected to bulky downstream equipment in order to store, or transmit, manipulate, reproduce, or display the signals. Simply stated, such an electronic camera was not fully portable. In order to provide a true electronic analog of a portable photographic camera, it is necessary that said electronic camera system, itself, also include apparatus for storing the electrical signals generated by said photosensor array. Only in this manner can such an electronic camera be available for use at remote location at which no downstream processing equipment is available.

These and other advantages of the instant invention will be apparent to those skilled in the art from the brief description of the invention, the drawings, the detailed description of the drawings and the claims which follow.

There is disclosed herein an electronic imaging system which includes a camera for sensing and digitizing images and for writing said digitized images onto a data storage medium. The camera includes a thin film photosensor array adapted to read a pattern of information incident thereupon and photogenerate detectable electrical signals corresponding thereto, the array including a plurality of small area photoresponsive elements, each of said elements adapted to photogenerate an electrical signal in response to the illumination thereof and including at least one layer of silicon semiconductor alloy material chosen from the group consisting of essentially of amorphous silicon alloy materials, amorphous germanium alloy materials, amorphous silicon carbon alloy materials, and amorphous silicon germanium alloy materials. The camera further includes a mechanism for optically projecting a pattern of information corresponding to a detectable image onto to said photosensor array, a trigger for initiating the reading of the pattern of information projected onto said photosensor array and a mechanism for writing the electrical signals photogenerated by the array onto the storage medium. The storage medium is preferably a phase change optical data storage medium.

More particularly, the optical storage medium is fabricated so as to include a layer of phase change material formed with at least one chalcogenide element selected from the group consisting essentially of selenium, tellurium, and combinations thereof. The chalcogenide medium may be a tellurium sub-oxide composition. For write once applications or a selenium germanium tin type compositions for erasable applications. The phase change memory optical material may even be formed of special compositions which are formed of direct overwrite media. While it is desired that the optical memory media be of the phase change variety, it is also possible to employ magnetic, magneto-optic or dye-polymer media.

In one preferred embodiment, the phase change optical memory material may be deposited onto an elongated tape which is of a length sufficient to store at least 25 color images thereupon so as to approximate the number of frames on conventional chemical rolls of film. In a second preferred embodiment, the phase change memory material may be deposited onto a disc-like member and again have a diameter sufficient to store said at least 25-36 color images thereupon. In either event, the writing mechanism includes at least one laser head, the laser head being capable of selective activation to write digitized electrical signals onto to the optical memory storage medium. In a preferred embodiment, multiple laser beams are operatively associated with said laser head so as to simultaneously write the electrically photogenerated signals onto the optical memory storage medium. In order to effect such writing, the writing mechanism and the optical memory storage medium are moveable relative to one another.

The plurality of photoresponsive elements are chosen from the group consisting essentially of photodiodes, phototransistors, photoresistors, photoconductors, photovoltaic elements, or combinations thereof. When the photoresponsive element is a photodiode, it will include two oppositely doped layers of semiconductor alloy material and a layer of substantially intrinsic semiconductor alloy material interposed between said oppositely doped layers. The thin film photosensor array will also include addressing circuitry for accessing specific ones of the plurality of photoresponsive elements. The addressing circuitry preferably includes a plurality of electrically conductive lines arranged so as to form an x-y matrix. The addressing circuitry will further include a current blocking element operatively associated with each of the photoresponsive elements, the blocking element and the address lines cooperating to provide electrical communication with pre-selected ones of the photoresponsive elements. In one preferred embodiment, the blocking elements are also formed as p-i-n type diodes.

The thin film photosensor array is preferably fabricated as a rectangular matrix having sides dimensioned to be at least 35 millimeters. The image resolution of the photosensor array is at least 20 lines per millimeter, and the photosensor array is fabricated as a rectangular matrix having sides dimensioned to at least 5.7 centimeters on an edge and including at least 1.4 million discrete photoresponsive elements. It is preferred that each array includes at least two groups of photoresponsive elements which cooperate to photogenerate an electrical signal corresponding to the color values of the image projected thereonto. In one embodiment, each of the groups of photoresponsive elements may include an optical filter for providing the sensitivity to different portions of electromagnetic spectrum incident thereupon.

The optical projecting mechanism will preferably include at least one lens and the trigger is preferably an electrical one adapted to initiate the reading of the pattern of projected information, said electrical trigger not including a shutter. The triggering event preferably comprises an electrical activation mechanism adapted to initiate reading and storing of said pattern of information.

It is possible, although not necessary, to further include a video display terminal as part of the system so as to receive the electrical signal corresponding to the projected pattern of information and provide an immediate visual display thereof, which display may be manipulated. It is also preferred that the phase change optical storage medium, whether tape or disc-like is provided in cartridge format so as to facilitate the loading and unloading thereof in said camera.

DETAILED DESCRIPTION OF THE DRAWINGS

Figure 1:
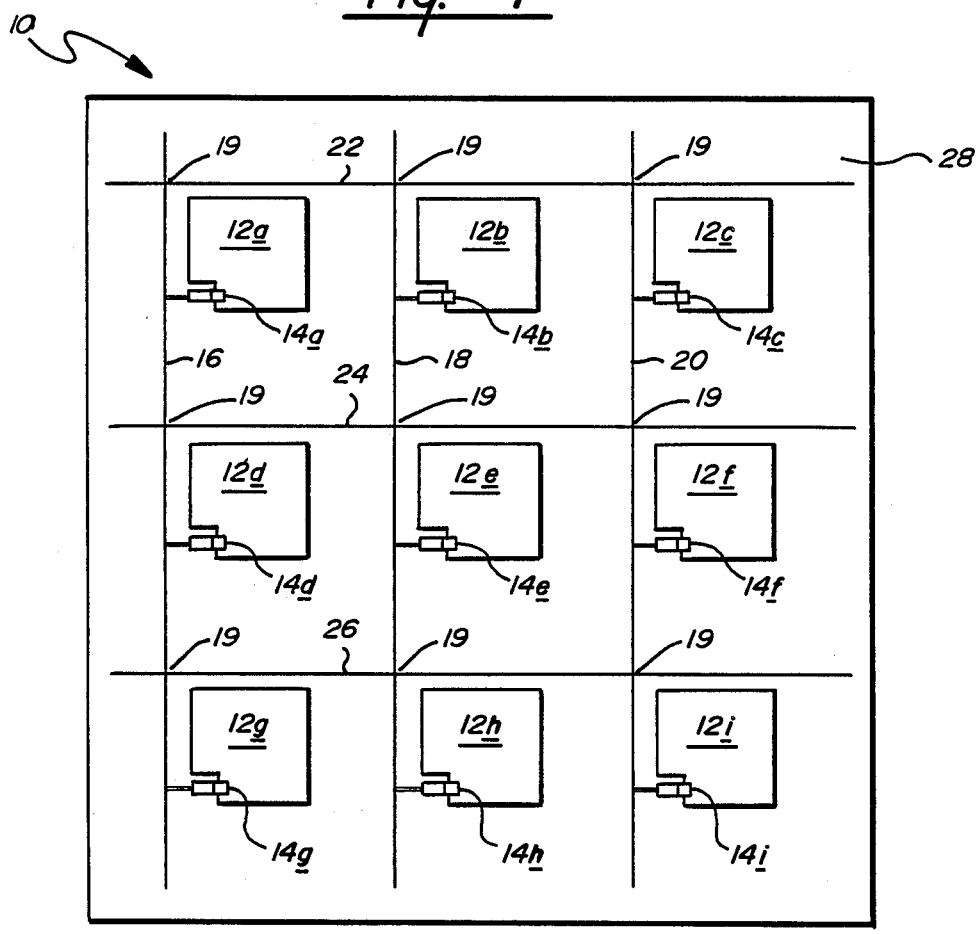
FIG. 1 is a top plan view of one embodiment illustrating an array of thin film photosensor elements which may be utilized in the practice of the instant invention.

Referring now to FIG. 1, there is shown, in top plan view, one particular array 10 of thin film photosensor elements, said array being representative of those which may be utilized in the electronic camera of the present invention. It is to be kept in mind that other (mxn) photosensor arrays may be similarly employed without departing from the spirit and scope of the combination of elements which define said invention.

The photosensor array 10 comprises a plurality of photosensitive elements 12a–12i operatively disposed in a two-dimensional matrix format. Each discrete one of the photosensitive elements, 12a–12i, has associated therewith an isolation device 14a–14i interconnecting that element photosensitive 12 to a grid of address lines. As illustrated in FIG. 1, the address grid includes a plurality of X (generally horizontal) address lines 16, 18 and 20 and a plurality of Y (generally vertical) address lines 22, 24 and 26, each of said address lines formed of an electrically conductive material, such as a metal or a conductive oxide.

The photosensor array 10 is formed upon a substrate 28, which may be a rigid member such as a glass or a metallic plate; or it may be a flexible member such as a thin metallic body or a sheet of synthetic polymeric material. In those instances wherein the substrate 28 is electrically conductive, it may be desirable to provide an insulating coating thereatop prior to the deposition of the address lines thereupon.

The discrete photosensor elements 12a–12i are photoresponsive devices, that is to say, they are adapted to generate a detectable electrical signal in response to the absorption of incident illumination. This electrical signal may comprise a detectable change in current, voltage, resistivity or the like. Among devices which may be utilized as photosensitive elements 12, are photodiodes, phototransistors, photoresistors, photoconductors, photovoltaic devices, taken either singly or in combination. One group of photosensitive elements having particular utility are p-i-n photovoltaic devices which comprise two oppositely doped layers of semiconductor alloy material having a body of substantially intrinsic semiconductor alloy material disposed therebetween. Such photosensitive elements may be used either singly or in stacked tandem combinations to photogenerate voltage and/or current in response to the absorption of incident illumination.

The isolation device 14, which device is associated with each of the photosensor elements, is utilized to restrict the flow of electrical current through the photosensor array 10 to predetermined paths so as to facilitate addressing of particular photosensor elements 12 of the array. The isolation device 14 may comprise any type of current control device such as a diode, a transistor, a threshold switch, a relay or the like. P-I-N type dioes have been found to be particularly useful in the fabrication of photosensor arrays; this is of particular value because the blocking elements can be fabricated simultaneously with the fabrication of the photoresponsive elements.

The grid of address lines 16, 18, 20, 22, 24 and 26 are arrayed in an X-Y matrix and electrically isolated at each of the cross-over points 19 thereof. By addressing particular pairs of address lines, distinct photosensor elements may be accessed. For example, by accessing address line 24 and address line 18 photosensor 12e is activated. The presence of the isolation devices 14 electrically connecting adjoining photosensor elements prevent the communication of unwanted electrical signals during the addressing process.

While a very wide variety of semiconductor alloy materials may be utilized from which to fabricate photosensor arrays 10 of the instant invention, it has been found particularly advantageous to utilize thin film semiconductor alloy materials chosen from the group consisting essentially of amorphous silicon alloy materials, amorphous germanium alloy materials and amorphous silicon germanium alloy materials. Such materials may be readily formed into large size photosensor arrays. As utilized herein, the term amorphous silicon alloy materials shall refer to alloys of silicon in combination with other elements or materials, as for example, compensating or modifying elements such as hydrogen, halogens, carbon and/or nitrogen. Similarly, the term germanium alloy materials shall refer to alloys of germanium in combination with other elements or materials. The term amorphous silicon germanium alloy shall refer to all alloys which include both silicon and germanium in any proportion with or without other elements or materials.

The array 10 may be made color responsive, that is to say, it may be fabricated so that the photoresponsive elements thereof photogenerated electronic signals which include information concerning the wavelength of light incident thereupon. Such techniques for providing color response are known to those skilled in the art and are disclosed in the commonly assigned patents and applications referred to hereinabove.

In a first preferred embodiment, the photoresponsive elements 12 may be divided into a plurality of groups, and each group provided with an appropriate optical filter to enable it to "see" only particular wavelengths of incident illumination. Such optical filters may be integrally formed with the elements 12, or they may be external and separate therefrom. In an alternatively preferred embodiment, the entire array may be sequentially exposed through a plurality of filters so as to create color separation images which can be combined to generate full color output therefrom.

In yet another preferred approach to color sensitivity the semiconductor alloy materials from which the photoresponsive elements are fabricated may have the band-gaps thereof adjusted by the addition of appropriate elements so as to color sensitize the individual elements to particular portions of the electromagnetic spectrum. Such techniques will be found for example, in commonly assigned U.S. Pat. No. 4,342,044 of Ovshinsky, et al, entitled "Method for Optimizing Photoresponsive Amorphous Alloys and Devices", the disclosure of which is incorporated herein by reference.

It should be apparent to one of skill in the art that while the photosensor array 10 of FIG. 1 is depicted as being a two dimensional matrix which comprise nine photosensor elements, in practicality an array comprising a two dimensional array formed of a much larger number of elements will be preferred. It should also be apparent that while the array 10 of FIG. 1 is depicted as being a two dimensional array, similar technology may be readily modified to provide a one dimensional, i.e. a linear array. Detailed descriptions of the operation and fabrication of both one and two dimensional photosensor arrays will be found in the commonly assigned patents referred to and incorporated by reference hereinabove. Note that the instant inventors believe 2-D arrays to be the preferred embodiment because of the length of time which is required for a one-dimensional array to scan an incident image.

It should be appreciated that the photosensor array, such as the array 10 of FIG. 1, is a partial analog of a conventional roll of photographic film. As such, the photosensor array may be incorporated into a camera to provide for electronic photography. The drawings are intended to be illustrative of various embodiments of cameras in which conventional photographic film has been replaced by thin film photosensor arrays for digitizing illumination incident thereupon. However, it should be kept in mind that many other similar camera embodiments can be employed, which camera embodiments will be readily apparent to one of skill in the photographic arts.

Figure 2:
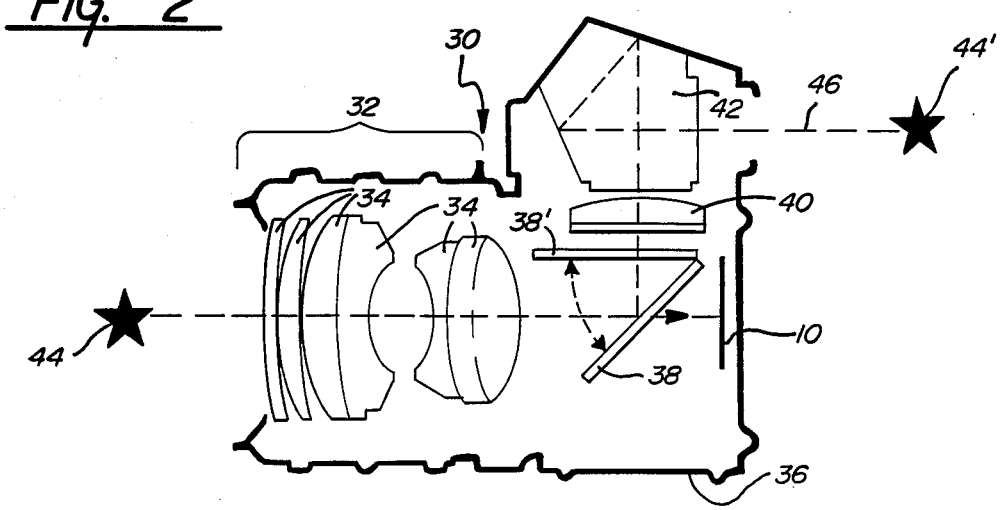
FIG. 2 is a cross sectional view illustrating a single lens reflex camera, as modified in accordance with the principles of the instant invention.

Referring now to FIG. 2, there is shown in cross-sectional view, a single lens reflex camera 30 as modified to operatively include a two dimensional photosensor array 10 therein. The camera 30 includes a lens assembly 32 which comprises a plurality of lens elements 34. The camera 30 further includes all operative elements necessary to electrically photograph an image, which elements include, inter alia, a body 36 housing the photosensor array 10, a mirror 38, a viewfinder lens 40 and a pentaprism 42.

The lens assembly 32 is adapted to gather light from an object being imaged (in this case the star 44), project that light into the camera body 36 and onto the mirror 38. The mirror 38 is adapted to reflect a portion of the light incident thereupon through the viewfinder lens 40 into the pentaprism 42 which redirects the light through a viewfinder aperture 46 so as to provide an image 44' of the object being photographed. This enables the photographer to compose the picture prior to the taking thereof. When a photograph is to be made, the mirror 38 swings to an upright position 38' to allow the incident light from the object 44 to strike the photosensor array 10. It is to be noted that the camera 30 need not and preferably does not include a shutter mechanism to control the duration of light falling upon the photosensor 10. This is because a battery for activating the array may serve as the electronic equivalent thereof. However, the camera may be equipped with an iris or other light control means to regulate the intensity of light incident upon the photosensor array 10.

The photosensor array 10 provides an electrical signal, preferably a digitized electrical signal, corresponding to the image projected thereupon. This signal may then be utilized to create a visual reconstruction of the object being photographed. Although not illustrated, the electrical signal provided by the photosensor 10 may be conveyed to a printer, copier or video display terminal for reproduction or manipulation of the image. Additionally, the electrical signal may be conveyed to a storage device such as a magnetic, optical, semiconductor or bubble memory for storage add later playback. Additionally, electronic image processing may be utilized to enhance, augment, or otherwise modify the photograph of the object in accordance with well known image manipulation and processing techniques.

The photosensor array 10 may be adapted to be either removably or permanently affixed within the camera body 36. While it was previously suggested that the photosensor array 10 formed a partial substitute for photographic film, a more direct analogy for photographic film would be the storage media upon which the digital signals generated by the photosensor elements are recorded. Regardless of the analogy, the array may be affixed to a conventional camera so as to convert that conventional camera into an electronic format. Other than affixing the array within the camera housing, the only other modification necessary would be to electrically connect the electrical output of the array to downstream signal processing apparatus. In many other instances, the camera body 36 may be specifically manufactured for electronic imaging by permanently affixing the photosensor array 10 therein. Through the judicious choice of the size of the photosensor array and the configuration of the camera body, lenses and the overall optical systems from conventional 35 mm cameras may be utilized with little or no alteration.

It is to be noted that electronic cameras may be provided with a plurality of interchangeably usable photosensor arrays 10, said arrays characterized by a wide variety of photoresponsive properties. For example, arrays may be fabricated so as to exhibit enhanced ultraviolet or infrared sensitivity for particular imaging applications; likewise arrays may be manufactured so as to exhibit increased or decreased resolution or higher or lower photosensitivity to particular wavelengths to enable them to be used for a variety of photographic applications. Obviously, many modifications of the electronic photographic system described herein will be apparent to the artisan in the photographic arts. For example, a rotatable turret or cassette, in which a plurality of photosensor arrays of differing resolution or color response, may be utilized to adapt the camera for the widest possible variety of uses.

Figure 3:
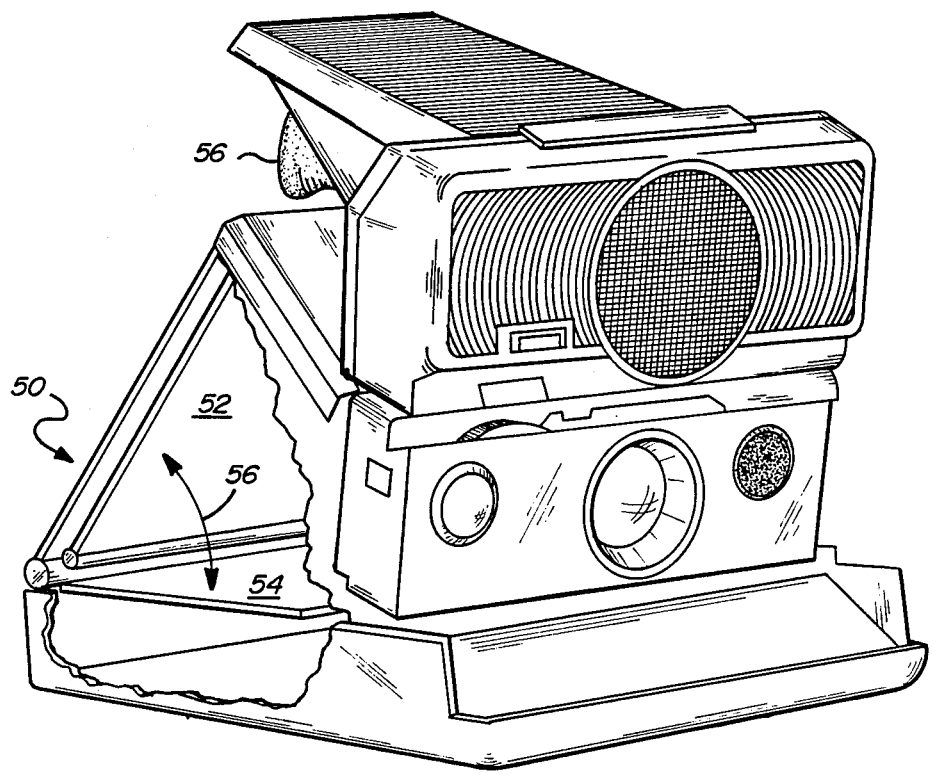
FIG. 3 is a perspective view, partially cut-away, illustrating a folding camera, as modified in accordance with the principles of the instant invention.

Referring now to FIG. 3, there is illustrated therein another embodiment of a conventionally styled camera 50, as modified in accordance with the instant invention so as to provide for electronic imaging. The electronic camera 50 depicted in FIG. 3 is a folding reflex camera, generally similar to those employed for instant photography. The camera 50 includes a mirror 52 disposed on the backside thereof, which backside mirror is adapted to reflect an image incident thereupon to a lower mirror 54. It is the image incident on the lower mirror which is viewed through a viewfinder 56. Note that when a photograph is to be taken, the lower mirror 54 pivots upwardly, as indicated by the arrow 56, so as to come to rest and lie atop the upper mirror 52. This allows the image to fall on the back surface of the lower mirror 54 upon which surface a photosensor array is operatively disposed. Other modifications of such instamatic cameras will be readily apparent to those ordinarily skilled in the art. For example, the back surface of the lower mirror 54 may also be reflective and the photosensor array may be operatively disposed in the same plane as the lower mirror 54 before it is pivoted upwardly.

Figure 4:
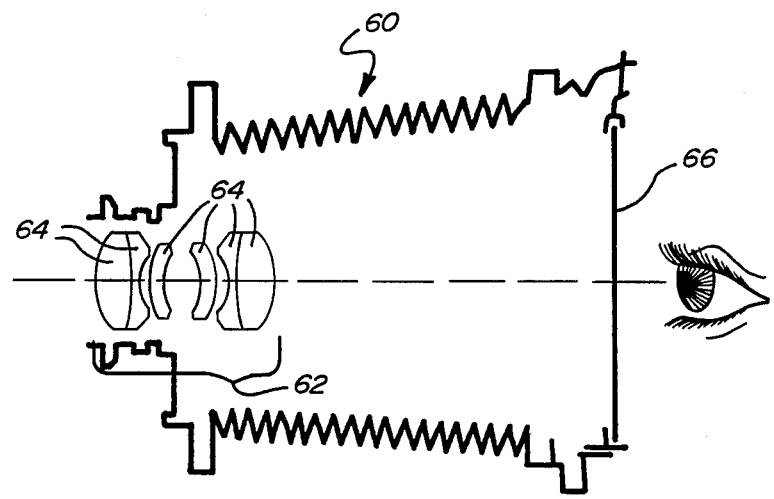
FIG. 4 is a schematic, cross-sectional view illustrating a view finding camera, as modified in accordance with the principles of the instant invention.

Referring now to FIG. 4, there is shown yet another embodiment of an electronic camera which falls within the scope of the instant invention. More particularly, FIG. 4 illustrates, in cutaway form, an embodiment of view camera 60 such as those commonly employed by professional photographers. View cameras typically include an optical lens system 62 comprising a plurality of lens elements 64 operatively disposed so as to project an image upon a ground glass viewing plate 66 for purposes of focusing and image composition. The typical view camera is provided with one or more removable film cassettes, not shown, adapted to hold a relatively large piece of photographic film, typically 4×5 or 8×10 inches in surface area. After the photograph is composed in the ground glass viewing plate 66, the film cassette is inserted into the camera, in the same plane as the viewing plate, and an exposure is made therefrom. It should be readily apparent that such a view camera is particularly amenable to be modified for electronic imaging because a cassette (cartridge or disc) in which the two-dimensional array of photosensor elements are disposed may be readily inserted thereinto. In this manner, conventionally available, professional model cameras may be utilized for electronic imaging without the necessity of effecting substantial modifications thereto.

In some cases, photographers may still find it desirable to utilize photochemically sensitive films. In such instances, an electronic image may be utilized to adjust the lighting, image composition, etc., prior to the actual exposure of conventional chemical photographic film. For example, a view camera, such as the camera 60 of FIG. 4, may have a thin film photosensor array inserted in a cassette housed therein and the output of such array electrically connected to and communicating with a video display terminal. The composition and lighting may then be adjusted so as to produce a desired visual effect, as observed on the terminal. Once the appropriate effect is obtained, the exposure may be calculated by numerical computation based upon the output signal generated by the photosensor array. After the composition and exposure data are obtained, the electronic photosensor array may be removed and conventional chemical film inserted for exposure and processing.

While the invention has been described with reference to image-wise utilization of a signal photogenerated by an array of thin film photosensor elements, such will not always be the case. For example, it may not be desirable to display an electronically reconstructed image; however, a photographer may wish to use data obtained therefrom to calculate exposure times as previously discussed with reference to the foregoing figure. Thin film photosensor arrays may be effectively employed as a light meter. Since the photosensor arrays are configured in two dimensional planar form by a plurality of photoresponsive elements, they effectively form a plurality of spot meters disposed in the plane of the projected image. The electrical output signals photogenerated by the discrete photosensor elements may be utilized for very accurately computing photographic exposures. For example, in a single lens reflex camera, such as the camera 30 of FIG. 2, the mirror 38 may be fabricated to include a plurality of spacedly disposed photoresponsive elements so as to be adapted for computation of exposure times for chemical films.

Figure 5:
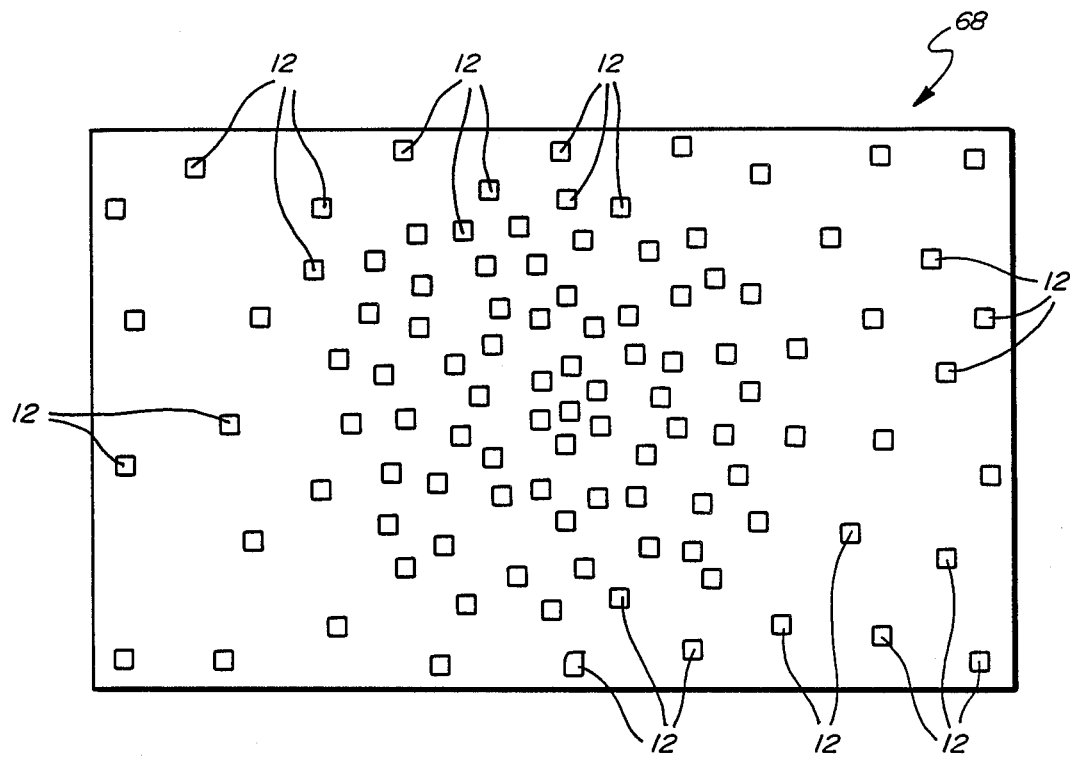
FIG. 5 is a top plan view illustrating a photosensor array-mirror combination structured in accordance with the principles of the instant invention and specifically adapted to control the exposure and focusing parameters in conjunction with a chemical photographic system.

With the foregoing description in mind and referring now to FIG. 5, there is shown a mirror 68 which includes a plurality of spacedly positioned, discrete photoresponsive elements 12 disposed thereupon. This mirror 68 may be directly substituted for the mirror 38 in the single lens reflex camera depicted in FIG. 2 or for the mirror 54 in the folding camera 50 depicted in FIG. 3; and the photoresponsive elements 12 may be utilized to compute exposure parameters. Although not apparent in the drawing, each of the discrete photoresponsive elements 12, will have appropriate addressing circuitry associated therewith.

It should also be noted from an inspection of FIG. 5 that the number of photoresponsive elements 12 per unit area are not equally distributed across the surface of the mirror 68; rather said photoresponsive elements increase in density adjacent the center of the mirror. This increase in density is for purposes of providing an increased weighting factor in the center of the image plane. Obviously, other similar distributions of photogenerative elements may be employed. For example, the density of photoresponse elements 12 may be equally distributed across the plane of the mirror 68, with an appropriate weighting factor achieved through electronic manipulation. All of such modifications should be well within the skill of the ordinary artisan and are intended to be within the scope of the present invention.

Figure 6:
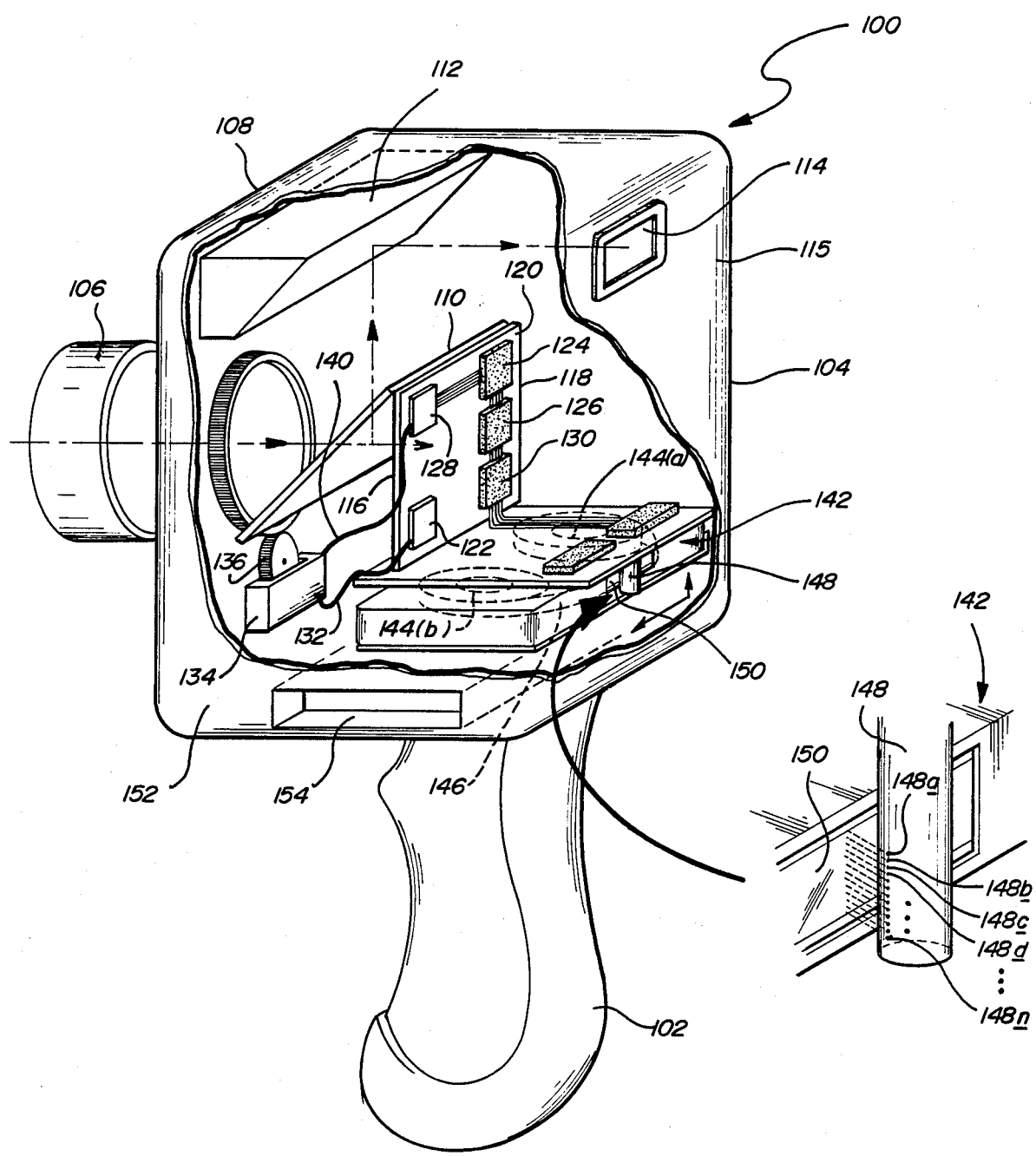
FIG. 6 is a perspective view, partially cut-away, illustrating the interior of an electronic camera which incorporates not only the thin film photosensor array depicted in FIG. 1, but also includes an electronic film cartridge of phase change optical memory material.
Figure 7:
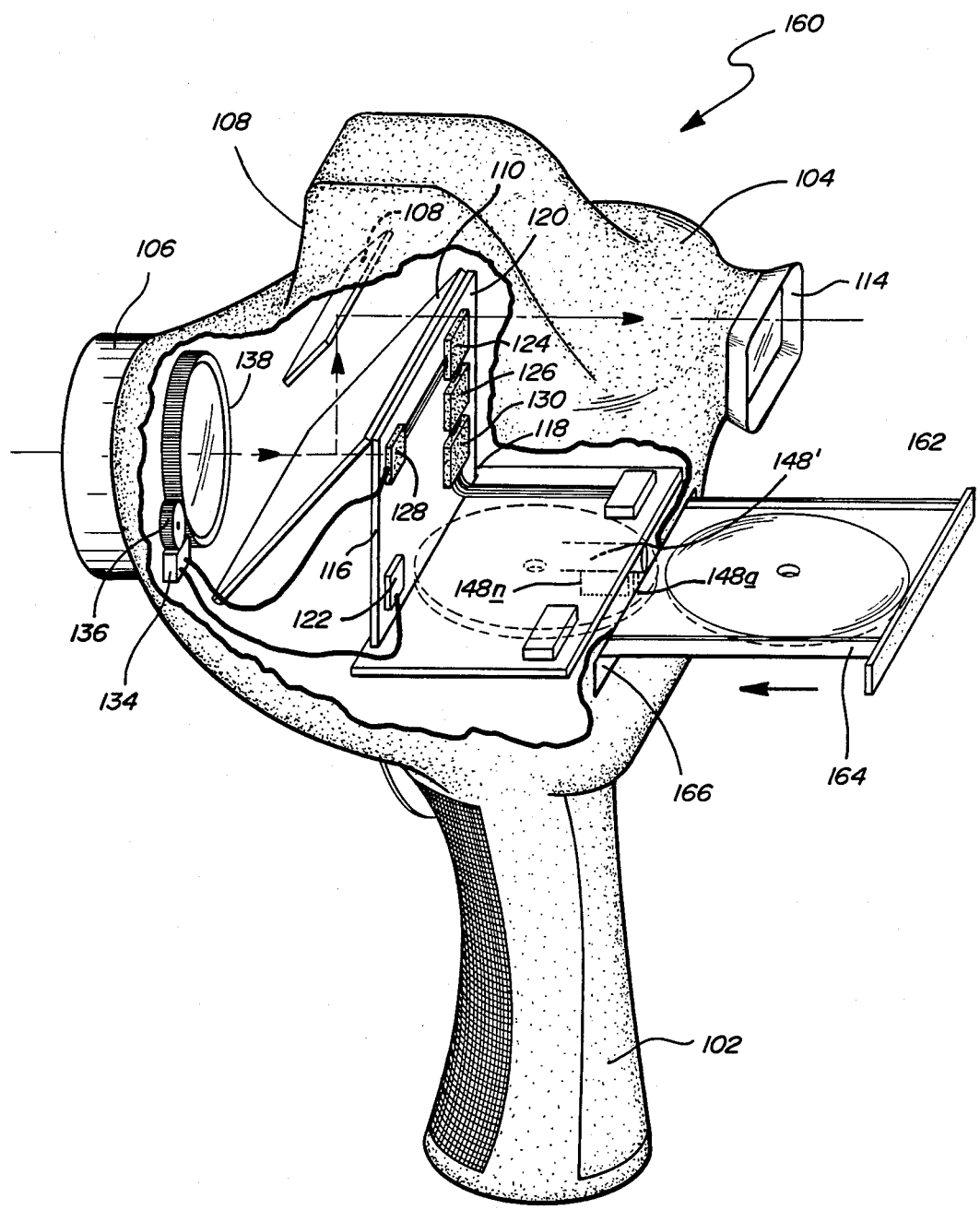
FIG. 7 is a perspective view illustrating the electronic camera depicted in FIG. 7 except that a disc-like phase change optical memory cartridge is shown replacing the tape-like phase change optical memory cartridge.

Turning now to FIGS. 6 and 7, the electronic cameras illustrated in FIGS. 2-4 are depicted in modified form so as to include various of the aforementioned elements as well as a storage media within the body thereof. Due to the fact that the electronic camera of the previous invention had to be connected to signal processing equipment, said camera was not truly portable. In contradistinction thereto, the electronic camera of the instant invention includes a storage media, in the form of an electronic film pack, housed within the camera body so as to provide for the truly portable operation thereof. The instant invention is particularly directed toward the combination of a photosensor array which is in intimate electrical communication with the data storage media, such as phase change optical memory media in cassette form, so as to be directly analogous to conventional photographic roll film. The instant invention is also directed to the provision of optical memory data storage cassettes in such a manner that they may be inserted into and removed from the camera for subsequent playback, editing, and hard copy reproduction of the images stored therein.

Referring now specifically to FIG. 6, there is illustrated generally by the reference numeral 100, one embodiment of the electronic camera of the instant invention. As was true of the electronic cameras shown in the aforedescribed drawings, the camera 100 depicted in FIG. 6 includes a 2-dimensional array of photoresponsive elements adapted to photogenerate electronic signals corresponding to the intensity of illumination reflected from an image and incident thereupon to thereby provide a digitized, high resolution, electronic picture of that image. However, unlike the previous camera embodiments, the electronic camera 100 is further equipped with a high density optical memory storage medium in cartridge format, which cartridge is capable of receiving and storing the digitized signals photogenerated by the array.

The electronic camera 100 includes a handle 102 upon which a generally rectangularly shaped, hollow housing 104 is supported. A cylindrically shaped lens system 106, which may be telescopic in nature, is centrally affixed to the front face 108 of the housing 104. Light reflected from an image enters the interior of the housing 104 through the lens system 106, is directed onto the front, generally planar surface of a half silvered mirror 110 from which (a) a portion of the rays of incident light are again reflected upwardly onto a prism 112 and through the view finder aperture 114 formed in the face 115 of the housing 104 for composing the picture, and (b) the remaining portion of the rays of incident light pass through the mirror 110 and strike the surface 116 of a planar plate 118 onto which the photosensor array (not shown) is operatively affixed. The rear surface 120 of the plate 118 includes a plurality of integrated circuit chips for effecting such camera related functions as (a) auto focusing accomplished by chip 122, (b) automatic exposure accomplished by chip 124, (c) automatic shutter control accomplished by chip 126, (d) automatic motor function control accomplished by chip 128 and (e) the digital signal writing function controlled by chip 130. It is to be understood that while five discrete intergrated circuit chips have been illustrated, the number of discrete chips may vary depending primarily upon the number of electronic control functions which are desired to be processed without manual intervention and depending upon the need for additional memory or buffering of the photogenerated signals. The exact number and intercommunication between the chips is well known to those of ordinary skill in the electronic automation of photographic arts and need not be detailed in further detail herein. It is also to be noted that the chips, such as the auto focusing chip 122 is operatively interconnected by wire 132 to motor 134, which motor rotates small gear ring 136 to correspondingly rotate large gear ring 138 and focus the lens system 106 of the electronic camera 100. Also, the chip 128 which controls various motor functions is interconnected to the motor 134 or another motor (not shown) by wire 140.

Finally, with respect to the optical memory storage cartridge of the instant invention, said cartridge is depicted generally by reference numeral 142. The optical memory cartridge 142 includes a pair of rotatable spools 144a and 144b about one of which a supply roll of optical memory data storage tape 146 is rotatably wound.

As the electronic camera 100 is utilized and an electronic picture is taken of a desired object, the roll of optical memory data storage tape is rotatably moved from, for instance, the left hand spool 144b toward and onto the right-hand, take-up spool 144a. As the storage tape rotates from the supply spool 144b to the take-up spool 144a, a laser head 148 disposed adjacent a cutout window portion 150 formed in a side panel of the body of the cartridge 142 optically "writes", in digital form, binary signals into the phase change memory material deposited onto at least side of the optical memory tape 146. The roll of optical memory tape 146 is of a sufficient length to store, for later processing, at least approximately twenty five color pictures. The inventors hereof have estimated that by utilizing a tape of no more than about 1 millimeter in width and 10 meters in length, the optical memory data storage tape will store a sufficient number of bits of information to reproduce 25 color photographs. It should be apparent that by allowing the tape to be wider and longer, any number of images may become stored on a single cartridge.

Concerning loading of the cartridge into the electronic camera 100, note that one of the side faces 152 of the hollow rectangularly shaped camera housing 104 may include a generally rectangularly shaped cutout into which the cartridge 142 is adapted to be loaded into the camera. The loading of the cartridge 142 is effected in a manner generally similar to that of loading a video tape cartridge into a video tape recorder. Specifically, the cartridge 142 is manually inserted into opening 154, the cartridge is then automatically moved interiorly and upwardly until it snaps into place so that the window 150 formed in the side panel thereof is operatively disposed adjacent the laser head 148. It is to be noted that the laser head 148 may have any number of laser beams associated therewith, such as 148a through 148n, so that multiple binary signals may be simultaneously recorded across the entire width of the tape 146 of optical memory data storage material 146 moving therepast. It is also to be noted that at the present time, the technology is already present for simultaneously addressing as many as 1056 discrete lasers for writing onto optical memory data storage media. Therefore, it is possible to employ a fairly wide strip of optical memory data storage tape 142 and either employ a length of tape which is of minimal width in order to enable the cartridge to store data from 25 pictures or to employ a fairly lengthy and relatively wide tape and store hundreds of pictures thereupon.

Referring now specifically to FIG. 7, there is generally illustrated therein by the reference numeral 160, a second embodiment of the electronic camera of the instant invention which includes both a photosensor array and an optical memory data storage cartridge. In connection of this FIG. 7 embodiment of the electronic camera, similar reference numerals have been employed to illustrate the components thereof which are essentially similar to those components just described and illustrated hereinabove with respect to the electronic camera 100 of FIG. 6. In this regard, the electronic camera 160 also includes a handle 102, a hollow housing 104 having a front face 108, which face 108 includes an opening through which a lens system 106 extends. The interior of the camera also is equipped with a planar plate 118 upon one surface of which a plurality of discrete integrated circuit chips of 122, 124, 126, 128 and 130 are operatively disposed and electrically interconnected to a motor 134. Gear rings 136 and 138 are again adapted to automatically take care of the focusing and other automated camera functions.

The electronic camera 160 also includes a half silvered mirror 110 and a prism or a second mirror 108 to enable the photographer to compose the picture in the viewfinder aperture 114. Disposed on the rear surface of the planar plate 118 is the array of photosensitive elements (not shown) for digitizing the image depending upon the intensity of illumination incident upon discrete elements thereof. The only significant manner in which the electronic camera 160 depicted in FIG. 7 differs from the electronic camera 100 depicted in FIG. 6 is that the optical memory data storage cartridge, rather then being rectangularly configured such as in FIG. 6, is configured in a generally disc-like shape as illustrated by reference numeral 162. In order to accommodate such a disc-like cartridge having optical memory data storage material deposited onto at least one surface thereof, a sliding drawer 164 is provided and adapted to movably translate through an opening 166 formed in the rear surface of the hollow camera housing 104. As the drawer 164 slides outwardly of the camera body 104, the disc-like cartridge 162 may be inserted thereonto. Then the drawer 164 is manually or electrically translated back into the interior of the camera housing 104. In its operative, laser writing-data storage position, the laser head, now referred to by numeral 148' (because the laser is illustrated as being horizontally disposed in FIG. 7 as opposed to the vertical disposition thereof in FIG. 6), remains stationary while the disc-like cartridge 162 is rotatably moved therepast. Again, by utilizing multiple laser beams 148a . . . 148n, a plurality of binary signals may be simultaneously stored in the optical memory data storage material so as to accelerate the writing process. It should be apparent that by controlling the diameter of the disc-like cartridge 162, the number of bits of information which may be inputted thereonto may be varied.

As to the optical data storage media, note that nonablative state changeable data storage media record information in a state changeable material that is switchable between at least two detectable states by the application of projected beam energy thereto, for example, optical energy.

State changeable data storage material is incorporated in a data storage device having a structure such that a layer of data storage material is encapsulated between encapsulant layers and supported by a substrate. For optical data storage devices the encapsulants include, for example, anti-ablation materials and layers, thermal insulation materials and layers, anti-reflection materials and layers, reflective layers, and chemical isolation layers. Moreover, various layers may perform more than one of these functions. For example, anti-reflection layers may also be anti-ablation layers and thermal insulating layers. The thicknesses of the layers, including the layer of state changeable data storage material, are optimized to minimize the energy necessary for state change and optimize the high contrast ratio, high carrier to noise ratio, and high stability of state changeable data storage materials.

The state changeable material is a material capable of being switched from one detectable state or states to another detectable state or states by the application of projected beam energy thereto. State changeable materials are such that the detectable states may differ in their morphology, surface topography, relative degree of order, relative degree of disorder, electrical properties, optical properties including indices of refraction and reflectivity, or combinations of one or more of these properties. The state of the state changeable material is detectable by the electrical conductivity, electrical resistivity, optical transmissivity, optical absorption, optical refraction, optical reflectivity, or combinations thereof.

The formation of data storage devices occurs in a vacuum process which includes the plasma deposition of the individual layers, for example by evaporative deposition. As used herein plasma deposition includes sputtering, glow discharge, and plasma assisted chemical vapor depositing.

Tellurium based materials have been utilized as state changeable materials for data storage where the state change is a structural change evidenced by a change in reflectivity. This effect is described, for example, in J. Feinleib, J. deNeufville, S. C. Moss, and S. R. Ovshinsky, "Rapid Reversible Light-Induced Crystallization of Amorphous Semiconductors," *Appl. Phys. Lett.,* Vol. 18(6), pages 254–257 (Mar. 15, 1971), and in U.S. Pat. No. 3,530,441 to S. R. Ovshinsky for METHOD AND APPARATUS FOR STORING AND RETRIEVING OF INFORMATION. A recent description of tellurium-germanium-tin systems, without oxygen, is in M. Chen, K. A. Rubin, V. Marrello, U. G. Gerber, V. B. Jipson, "Reversability And Stability of Tellurium Alloys for Optical Data Storage," *Appl. Phy. Lett.,* Vol. 46(8), pages 734–736 (Apr. 15, 1985). A recent description of tellurium-germanium-tin systems with oxygen is in M. Takenaga, N. Yamada, S. Ohara, K. Nishiciuchi, M. Nagashima, T. Kashibara, S. Nakamura, and T. Yamashita, "New Optical Erasable Medium Using Tellurium Sub-oxide Thin Film." PROCEEDINGS, SPIE CONFERENCE ON OPTICAL DATA STORAGE, ARLINGTON, VA, 1983, pages 173–177.

Tellurium based state changeable materials, in general, are single or multi-phased systems (1) where the ordering phenomena include a nucleation and growth process (including both or either homogeneous and heterogeneous nucleations) to convert a system of disordered materials to a system of ordered and disordered materials, and (2) where the vitrification phenomenon includes melting and rapid quenching of the phase changeable material to transform a system of disordered materials. The above phase changes and separations occur over relatively small distances, with intimate interlocking of the phases and gross structural discrimination, and are highly sensitive to local variations in stoichiometry. It is to be noted that exact nature of the phase change optical memory material is not critical to the operation of the electronic camera of the instant invention and that the aforementioned compositions are exemplary and not definitive.

Obviously, many modifications of the instant invention may be made in keeping with the general principle that a high resolution electronic camera be manufactured utilizing thin film arrays of photosensor elements, which cameras have not only the ability to digitize image information, but also the ability to store the photogenerated image information onto optical storage media. The foregoing drawings and discussion are merely meant to be illustrative of the general principles of the instant invention and not limitations upon the practice thereof. It is the following claims, including all equivalents, which are meant to define the scope of the instant invention.

What is claimed is:

1. An electronic imaging system, said system including a camera for (1) sensing and digitizing images and (2) writing said digitized images onto a storage media; said camera including:
   a two dimensional thin film photosensor array for reading a pattern of information corresponding to an image incident thereupon and generating detectable electrical signals corresponding thereto;
   said array including a plurality of small area photoresponsive elements, each of said elements capable of photogenerating an electrical signal in response to illumination incident thereupon and including at least one layer of a semiconductor alloy material chosen from the group consisting essentially of: amorphous silicon alloy materials, amorphous germaium alloy materials, amorphous silicon carbon alloy materials and amorphous silicon germanium alloy materials;
   lens means for optically projecting a pattern of information corresponding to an image onto said photosensor array;
   means for triggering the reading of the pattern of information projected onto said photosensor array;
   means for storing said detectable electrical signals generated by said photosensor array, said storing means including optical storage media; and
   means for writing said detectable electrical signals onto said storing means.

2. A system as in claim 1, wherein said optical storage media includes a layer of chalcogenide phase change optical memory material selected from the group consisting essentially of selenium, tellurium, and combinations thereof.

3. A system as in clam 2, wherein said chalcogenide element is a tellurium sub-oxide composition.

4. A system as in claim 3, wherein said chalcogenide element is a selenium germanium tin composition.

5. A system as in claim 2, wherein said phase change optical memory material is erasable.

6. A system as in claim 2, wherein said phase change optical memory material is write only.

7. A system as in claim 2, wherein said phase change optical memory material is directly over-writable.

8. A system as in claim 2, wherein said phase change optical memory material is deposited onto an elongated tape.

9. A system as in claim 8, wherein said tape is of a length sufficient to store at least 25 color images.

10. A system as in claim 2, wherein said phase change optical memory material is deposited onto a disc-like member.

11. A system as in claim 10, wherein said disc is of a diameter sufficient to store at least 25 color images.

12. A system as in claim 1, wherein said writing means includes at least one laser, said laser being selectively activatable to write digitized electrical signals onto said storage media.

13. A system as in claim 12, wherein multiple lasers are provided so as to simultaneously write multiple signals onto said storage media.

14. A system as in claim 1, wherein said writing means and said storage media are movable relative to one another.

15. A system as in claim 14, wherein said writing means is stationary and said storage media moves relative thereto.

16. A system as in claim 1, wherein said plurality of photoresponsive elements are chosen from the group consisting essentially of: photodiodes, phototransistors, photoresistors, photovoltaic devices, or combinations thereof.

17. A system as claim 16, wherein each of said photoresponsive elements is a photodiode which includes two oppositely doped layers of semiconductor alloy material, and a layer of substantially intrinsic semiconductor alloy material interposed between said oppositely doped layers so as to form a p-i-n type photodiode.

18. A system as in claim 16, wherein said thin film photosensor array further includes addressing means for accessing discrete ones of the plurality of photoresponsive elements.

19. A system as in claim 18, wherein said addressing means includes a plurality of electrically conductive lines arranged in an x-y matrix.

20. A system as in claim 19, wherein said addressing means further includes a current blocking element associated with each photoresponsive element, said blocking element and said conductive lines cooperating to provide electrical communication with pre-selected ones of said photoresponsive elements.

21. A system as in claim 20, wherein each of said blocking elements is a p-i-n type diode.

22. A system as in claim 16, wherein said thin film photosensor array is fabricated as a rectangular matrix dimensioned to be at least 35 mm on a side.

23. A system as in claim 22, wherein the image resolution of said photosensor array is at least 20 lines/mm.

24. A system as in claim 16, wherein said photosensor array is fabricated as a rectangular matrix dimensioned to be at least 5.7 cm on a side and including at least 1.4 million discrete photoresponsive elements.

25. A system as in claim 16, wherein each array includes at least two groups of photoresponsive elements; and each of said groups of photoresponsive elements includes an optical filter for providing sensitivity to different portions of the electromagnetic spectrum.

26. A system as in claim 1, wherein said triggering means comprises electrical means adapted to initiate the reading and storing of said pattern of information.

27. A system as in claim 26, wherein said electrical means includes address circuitry for accessing said photosensor array.

28. A system as in claim 26, wherein at least a portion of said address circuitry is integrated on a single substrate with said photosensor array.

29. A system as in claim 1, further including a video display terminal adapted to receive the electrical signal corresponding to the projected pattern and provide a visual display thereof.

30. A system as in claim 1, wherein said storage media is provided in cartridge form for facilitating the loading thereof in said camera.

* * * * *